(12) United States Patent
Jeon et al.

(10) Patent No.: US 9,496,494 B2
(45) Date of Patent: Nov. 15, 2016

(54) RESISTIVE RANDOM ACCESS MEMORY DEVICES FORMED ON FIBER AND METHODS OF MANUFACTURING THE SAME

(71) Applicant: SAMSUNG ELECTRONICS CO., LTD., Suwon-si (KR)

(72) Inventors: Sang-hun Jeon, Seoul (KR); Jong-jin Park, Hwaseong-si (KR); Ji-hyun Bae, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 7 days.

(21) Appl. No.: 14/096,448

(22) Filed: Dec. 4, 2013

(65) Prior Publication Data

US 2014/0151623 A1 Jun. 5, 2014

(30) Foreign Application Priority Data

Dec. 4, 2012 (KR) .................. 10-2012-0139831

(51) Int. Cl.
*H01L 29/792* (2006.01)
*H01L 45/00* (2006.01)
*H01L 27/24* (2006.01)

(52) U.S. Cl.
CPC ......... *H01L 45/145* (2013.01); *H01L 27/2409* (2013.01); *H01L 45/04* (2013.01); *H01L 45/12* (2013.01); *H01L 45/1233* (2013.01); *H01L 45/144* (2013.01); *H01L 45/146* (2013.01); *H01L 45/147* (2013.01); *H01L 45/149* (2013.01); *H01L 45/16* (2013.01)

(58) Field of Classification Search
CPC ................... H01L 2021/775; H01L 27/1023; H01L 27/108; H01L 27/11; H01L 2924/1435; H01L 2924/1436; H01L 2924/14361; H01L 2924/1437; H01L 2924/1443
See application file for complete search history.

(56) References Cited

U.S. PATENT DOCUMENTS

| 6,683,322 | B2 | 1/2004 | Jackson et al. | |
|---|---|---|---|---|
| 8,177,834 | B2 | 5/2012 | Carlson et al. | |
| 2006/0198209 | A1* | 9/2006 | Tran | 365/189.05 |
| 2007/0116411 | A1* | 5/2007 | Benton | G02B 6/3825 385/53 |
| 2010/0108972 | A1* | 5/2010 | Zhao et al. | 257/2 |
| 2010/0118595 | A1* | 5/2010 | Bae et al. | 365/148 |
| 2011/0156132 | A1* | 6/2011 | Kiyotoshi | H01L 27/11575 257/326 |
| 2013/0256624 | A1* | 10/2013 | Kau | 257/4 |

FOREIGN PATENT DOCUMENTS

| KR | 10-2008-0108047 A | 12/2008 |
|---|---|---|
| KR | 10-1089066 B1 | 12/2011 |
| KR | 10-2012-0050946 A | 5/2012 |

OTHER PUBLICATIONS

Jin-Woo Han et al., "Copper oxide resistive switching memory for e-textile"; Center for Nanotechnology, NASA Ames Research Center; Sep. 21, 2011, 9 pgs.

* cited by examiner

*Primary Examiner* — Earl Taylor
*Assistant Examiner* — Samuel Park
(74) *Attorney, Agent, or Firm* — Sughrue Mion, PLLC

(57) ABSTRACT

Provided is a memory device formed on a fiber. The memory device includes a lower electrode, a memory resistance layer, and an upper electrode, which are sequentially formed on a surface of the fiber. The memory resistance layer may have variable resistance properties. The memory device may further include an intermediate electrode and a switching layer formed between the memory resistance layer and the upper electrode.

8 Claims, 5 Drawing Sheets

RESISTIVE RANDOM ACCESS MEMORY DEVICES FORMED ON FIBER AND METHODS OF MANUFACTURING THE SAME

CROSS-REFERENCE TO RELATED APPLICATIONS

This application claims priority from Korean Patent Application No. 10-2012-0139831, filed Dec. 4, 2012, in the Korean Intellectual Property Office, the disclosure of which is incorporated by reference herein in its entirety.

BACKGROUND

1. Field

The present disclosure relates to fiber memory devices, and more particularly, to methods of manufacturing resistive random access memory (RRAM) devices formed on fiber.

2. Description of the Related Art

Due to the increased usage of electronic devices in a wide variety of fields, there is increased demand for electronic devices that have a structure that can overcome the limitations of existing electronic devices formed on a silicon or glass substrate. In particular, the use of electronic devices in advanced applications, such as smart clothes, dielectric elastomer actuators (DEAs), electroactive electrodes, and detection of an electrical signal from a living body, has received considerable attention. When information obtained from a sensor built on a fabric platform is transmitted to an external device, it is energy efficient to include a memory device, which stores data for a predetermined amount of time, together with the sensor. In this regard, nonvolatile memory devices are particularly necessary in order to minimize static power consumption.

In general, a semiconductor memory device includes a plurality of memory cells which are connected together by circuits. In a Dynamic Random Access Memory (DRAM), which is a representative semiconductor memory device, each memory cell includes one switch and one capacitor. While a DRAM provides high integration density and high speed, all data stored in it is lost when power is removed. A representative non-volatile memory device that retains stored data in the absence of power is a flash memory. Although flash memories have non-volatile characteristics, unlike volatile memories, they may have low integration density and low speed.

Much research has recently been conducted on nonvolatile memory devices such as Magnetic Random Access Memory (MRAM), Ferroelectric Random Access Memory (FRAM), Phase-change Random Access Memory (PRAM), and Resistance Random Access Memory (RRAM).

SUMMARY

One or more embodiments provide resistive random access memory (RRAM) devices formed on a fiber and methods of manufacturing the same.

Additional aspects will be set forth in part in the description which follows and, in part, will be apparent from the description, or may be learned by practice of the presented embodiments.

According to an aspect of an exemplary embodiment, there is provided an RRAM device formed on a fiber includes fiber, a lower electrode disposed on the fiber, a memory resistance layer disposed on the lower electrode, and an upper electrode disposed on the memory resistance layer.

The RRAM device may further include an intermediate electrode and a switching layer interposed between the memory resistance layer and the upper electrode.

The fiber may be made of a natural fiber, a chemical fiber, or a combination thereof.

The fiber may include polystyrene, polyester, or polyurethane.

The fiber may have a diameter of about 20 nm to about 150 μm.

The fiber may be made of a unidirectional fabric, a quasi-unidirectional fabric, a flat yarn, or a nanofiber.

The fiber may have a coating layer of a conductive material formed on its surface.

The coating layer may have a thickness of about 100 nm to about 10 μm.

The memory resistance layer may be formed of silicon oxide, tungsten oxide, niobium oxide, germanium antimony telluride ($Ge_2Sb_2Te_5$) zirconium oxide, hafnium oxide, silicon carbide (SiC), titanium oxide, tantalum oxide, praseodymium calcium manganese oxide (PrCaMnO), polyfluorene based organic material, zinc oxide, aluminum oxide, Nb-doped strontium titanium oxide ($SrTiO_3$) vanadium oxide, Al—Nb co-doped lead zirconium titanium oxide (PbZrTiO), lanthanum aluminum oxide ($LaAlO_3$), Cu-doped molybdenum oxide, gadolinium oxide, lanthanide oxide, praseodymium oxide, dysprosium oxide, europium oxide, or copper carbide (CuC).

The RRAM device may be connected to a textile-based sensor system.

The RRAM device may further include an insulation layer formed between the fiber and the lower electrode.

According to another aspect of another exemplary embodiment, there is a method of manufacturing an RRAM device formed on a fiber, the method including: planarizing a surface of the fiber and forming a lower electrode; forming a memory resistance layer on the lower electrode; and forming an upper electrode on the memory resistance layer.

In the planarizing of the surface of the fiber, a conductive material layer may be formed on the surface of the fiber by using an electroless plating or sputtering process.

The method may further include forming an intermediate electrode and a switching layer on the memory resistance layer and forming an upper electrode on the switching layer.

BRIEF DESCRIPTION OF THE DRAWINGS

These and/or other aspects will become apparent and more readily appreciated from the following description of exemplary embodiments, taken in conjunction with the accompanying drawings of which.

DETAILED DESCRIPTION

Figure 1:
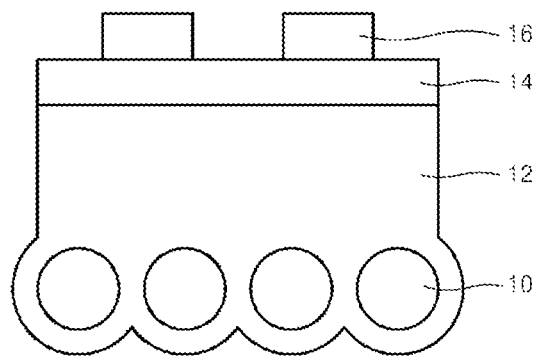
FIG. 1 illustrates a structure of a resistive random access memory (RRAM) device formed on a fiber according to an exemplary embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, expressions such as "at least one of," when preceding a list of elements, modify the entire list of elements and do not modify the individual elements of the list.

Resistive random access memory (RRAM) devices formed on fibers according to exemplary embodiments will now be described in detail. In the drawings, thicknesses of layers or regions are exaggerated for clarity.

Figure 2:
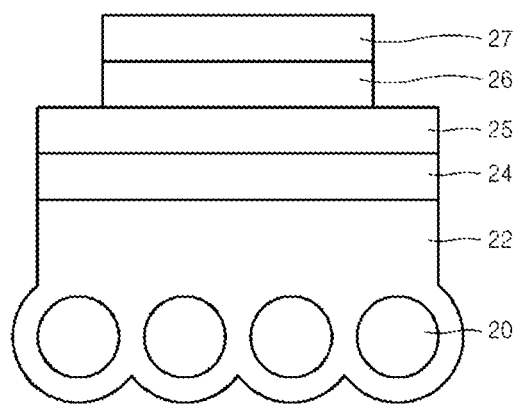
FIG. 2 illustrates a structure of an RRAM device formed on a fiber, which includes a material layer having threshold switching characteristics, according to another exemplary embodiment.

FIGS. 1 and 2 illustrate structures of RRAM devices fabricated on fibers 10 and 20 according to exemplary embodiments.

Referring to FIG. 1, an RRAM device fabricated on a fiber 10 includes a lower electrode 12 formed on the fiber 10, a memory resistance layer 14 formed on the lower electrode 12, and an upper electrode 16 formed on the memory resistance layer 14.

Referring to FIG. 2, an RRAM device fabricated on a fiber 20 includes a lower electrode 22 formed on the fiber 20, a memory resistance layer 24, an intermediate electrode 25, a switching layer 26 and an upper electrode 27, each of which are sequentially formed over the lower electrode 22.

Materials of the respective layers of the RRAM devices of FIGS. 1 and 2 fabricated on fibers 10 and 20 are described below.

The fiber 10 or 20 may have a two-dimensional (2D) shape formed by weaving a plurality of flexible fabric strands into a predetermined pattern. A surface of the fiber 10 or 20 may include a coated conductive material. Each of the fibers 10 and 20 may have a length that is several dozen to several hundred times, e.g., 100 to 1000 times, greater than its cross-sectional width. Thus, the aspect ratio of the fibers may be from 100 to 1000. The fiber 10 or 20 may be made from a flexible natural fiber, a flexible chemical fiber, or a combination thereof. The fibers 10 and 20 exhibit excellent surface smoothness, water resistance, and tensile strength. For example, the fibers 10 and 20 may include polymers such as polystyrenes, polyesters, or polyurethanes. However, the inventive concept is not limited thereto, and the fibers 10 and 20 may be natural fibers made from wood pulp, linen, Ramie, hemp, or wool; or chemical fibers made from vinylon, nylon, acryl, rayon, or asbestos. The fiber 10 or 20 may be composed of a single fiber strand or multiple fiber strands, and may have any of various cross-sectional shapes including but not limited to circular shapes, oval shapes, and polygonal shapes such as a quadrangle. The diameters of the fibers 10 and 20 may vary as needed, and may be, for example, from 20 nm to 150 µm. Furthermore, the fibers 10 and 20 may have nano-sized diameters ranging from several nm to several hundred nm.

As described above, the diameters, cross-sectional shapes, and the surface smoothness of the fiber 10 or 20 on which the RRAM is fabricated are not limited to the embodiments disclosed. Thus, each of the fibers 10 and 20 may include unidirectional fabric having fibers running in one direction or quasi-unidirectional fabric. Alternatively, the fibers 10 and 20 may be flat yarns having substantially smooth surfaces, or nano-sized fibers having very small diameters.

The surfaces of the fibers 10 and 20 may selectively include coating layers of conductive materials. The coating layers may be formed from the same materials as those of the lower electrodes 12 and 22 during the formation of the lower electrodes 12 and 22. For example, each coating layer may be formed from nickel (Ni), copper (Cu), or gold (Au) by using electroless plating or sputtering. The coating layer may have a thickness of about 100 nm to about 10 µm, but is not limited thereto.

Each of the lower electrodes 12 and 22, the intermediate electrode 25, and the upper electrodes 16 and 27 may be formed of a conductive material, and may be at least one of a metal, a metal alloy, a conductive metal oxide, or a conductive polymer. For example, the conductive material may be sodium (Na), magnesium (Mg), aluminum (Al), silicon (Si), potassium (K), calcium (Ca), scandium (Sc), titanium (Ti), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), cesium (Cs), barium (Ba), hafnium (Hf), tantalum (Ta), tungsten (W), rhenium (Re), iridium (Ir), platinum (Pt), gold (Au), mercury (Hg), lead (Pb), lanthanum (La), cerium (Ce), praseodymium (Pr), neodymium (Nd), promethium (Pm), samarium (Sm), europium (Eu), dysprosium (Dy), holmium (Ho), erbium (Er), thulium (Tm), ytterbium (Yb), lutetium (Lu), or graphene.

The lower electrode 12 and the upper electrode 16 in FIG. 1, or the lower electrode 22, the intermediate electrode 25, and the upper electrode 27 in FIG. 2 may have a single layer structure or a multi-layer structure consisting of the same or different materials. Although FIGS. 1 and 2 show memory cell structures formed on the fibers 10 and 20, respectively, an array structure may be formed which includes the memory resistance layers 14 (24 in FIG. 2) located at intersections of a plurality of lower electrodes 12 (22 in FIG. 2)) arranged in a first direction, and a plurality of upper electrodes 16 (27 in FIG. 2) arranged in a second direction.

An insulating layer containing an insulating material may be selectively formed between the fiber 10 (20 in FIG. 2) and the lower electrode 12 (22 in FIG. 2). When the lower electrode 12 (22 in FIG. 2) is disposed directly on the fiber 10 (20 in FIG. 2), the lower electrode 12 may planarize the surface of the fiber 10 (20 in FIG. 2). On the other hand, when an insulating layer having a desired thickness is formed between the fiber 10 (20 in FIG. 2) and the lower electrode 12 (22 in FIG. 2), the insulating layer may serve to planarize the surface of the fiber 10 (20 in FIG. 2) or isolate the lower electrode 12 (22 in FIG. 2) from the fiber 10 (20 in FIG. 2).

The memory resistance layer 14 (24) may be formed from a variable resistance material having a resistance that varies depending on the applied voltage. The variable resistance material may be a transition metal oxide (TMO), a perovskite-based material, or other materials having variable resistance properties. For example, the memory resistance layer 14 (24 in FIG. 2) may be made from silicon oxide, tungsten oxide, niobium oxide, germanium antimony telluride ($Ge_2Sb_2Te_5$) zirconium oxide, hafnium oxide, silicon carbide (SIC), titanium oxide, tantalum oxide, praseodymium calcium manganese oxide (PrCaMnO), polyflourene based organic material, zinc oxide, aluminum oxide, Nb-doped strontium titanium oxide ($SrTiO_3$) vanadium oxide, Al—Nb co-doped lead zirconium titanium oxide (PbZrTiO), lanthanum aluminum oxide ($LaAlO_3$), Cu-doped molybdenum oxide, gadolinium oxide, lanthanide oxide, praseodymium oxide, dysprosium oxide, europium oxide, or copper carbide (CuC).

The RRAM devices formed on the fibers 10 and 20 according to the exemplary embodiments may be electrically connected with a switch structure, such as transistors or diodes. The switching layer 26 in FIG. 2 may be formed of a silicon diode or oxide diode.

Figure 3A:
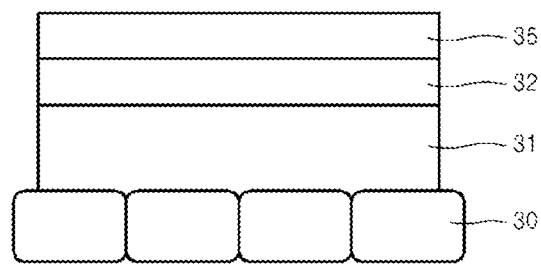
FIGS. 3A and 3B illustrate examples of RRAM devices formed on a fiber having a planar surface.
Figure 3B:
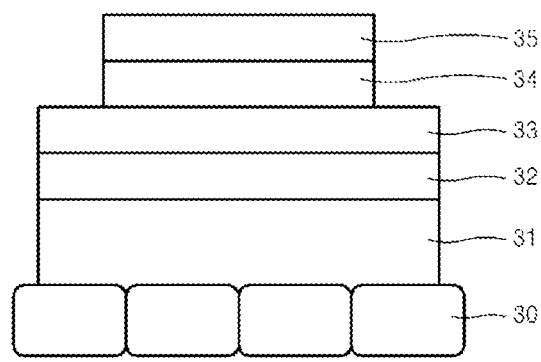

FIGS. 3A and 3B illustrate examples of RRAM devices formed on a fiber 30 having a planar surface.

Referring to FIG. 3A, an RRAM device includes a lower electrode 31, a memory resistance layer 32, and an upper electrode 35 which are sequentially disposed on the fiber 30 having a planar surface. Referring to FIG. 3B, an RRAM device includes a lower electrode 31, a memory resistance layer 32, an intermediate electrode 33, a switching layer 34, and an upper electrode 35 which are sequentially disposed on the fiber 30 having a planar surface.

The fiber 30 has a rectangular cross-section with a substantially planar surface. For example, a textile fiber having such a planar surface may be a flat yarn which has an excellent surface roughness compared to other textile fibers.

Figure 4A:
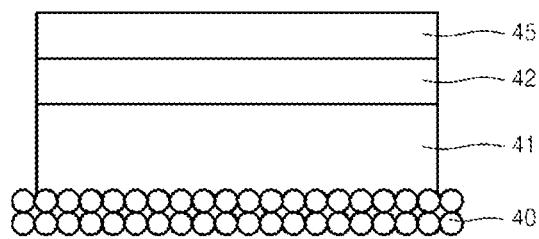
FIGS. 4A and 4B illustrate examples of RRAM devices formed on a fiber having a nano-sized diameter.
Figure 4B:
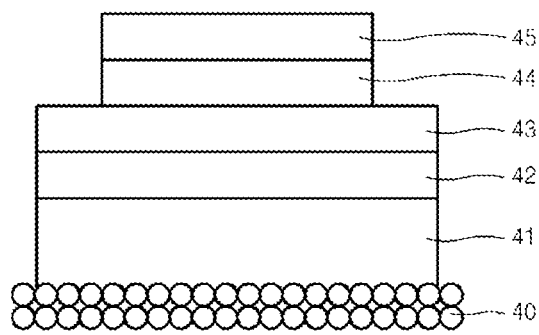

FIGS. 4A and 4B illustrate examples of RRAM devices formed on a fiber 40 having a nano-sized diameter.

Referring to FIG. 4A, an RRAM device includes a lower electrode 41, a memory resistance layer 42, and an upper electrode 45 which are sequentially disposed on the fiber 40 having a nano-sized diameter. Referring to FIG. 4B, an RRAM device includes a lower electrode 41, a memory resistance layer 42, an intermediate electrode 43, a switching layer 44, and an upper electrode 45 which are sequentially disposed on the fiber 30 having a nano-sized diameter.

The fibers 40 shown in FIGS. 4A and 4B are nanofibers having a very small thickness, e.g., of about 50 nm. The nanofiber may be produced by, for example, using electrospinning and provides a good planarization performance due to its good surface roughness characteristics.

A method of manufacturing an RRAM device according to an exemplary embodiment is now described. First, a fiber containing at least one fiber strand is prepared, and then planarized. Since the prepared fiber will most likely have an embossed or warped surface, planarization of the surface is required to form an RRAM thereon. As described above, when the fiber is a flat yarn or nanofiber having an excellent surface roughness, a thin conductive material layer may be formed on the surface of the fiber. On the other hand, when the fiber has an extremely uneven surface due to poor surface roughness, a thick conductive material layer may be formed. The planarization may be performed simultaneously with the formation of a lower electrode. For planarization of the surface of the fiber, an electroless plating or sputtering process may be used, but the exemplary embodiments are not limited thereto.

As described above, an insulating layer of an insulating material may be sandwiched between the fiber and the lower electrode. The insulating layer may be provided for planarization of the surface of the fiber or for isolation and may be made from silicon oxide, silicon nitride, other oxides or nitrides, a photocurable insulating material, or polymer silicone rubber. The insulating layer may be formed using various methods according to the type of materials contained therein. The methods may include chemical vapor deposition (CVD), physical vapor deposition (PVD), and spin coating, but are not limited thereto. For example, a silicone rubber, an organic material, or a solvent may be spin-coated onto the fiber and cured by using ultraviolet (UV) radiation.

After forming the lower electrode, having a desired thickness for planarization of the surface of the fiber, a memory resistance layer and an upper electrode may be sequentially formed, or an intermediate electrode and a switching layer may be selectively and sequentially formed between the memory resistance layer and the upper electrode. These layers may be formed using, for example, a PVD or CVD process.

An RRAM device formed on a fiber according to an exemplary embodiment may be connected to a textile-based sensor system and may have an array structure. The sensor system may include various sensors such as a biosensor, a light sensor, a gas sensor, a touch sensor, a tactile sensor, a pressure sensor, a temperature sensor, or the like. The sensor system may include a logic device which is connected to the RRAM device formed on the fiber. Information detected by the various sensors in the sensor system may be stored in the RRAM device before transmission to the outside.

Figure 5:
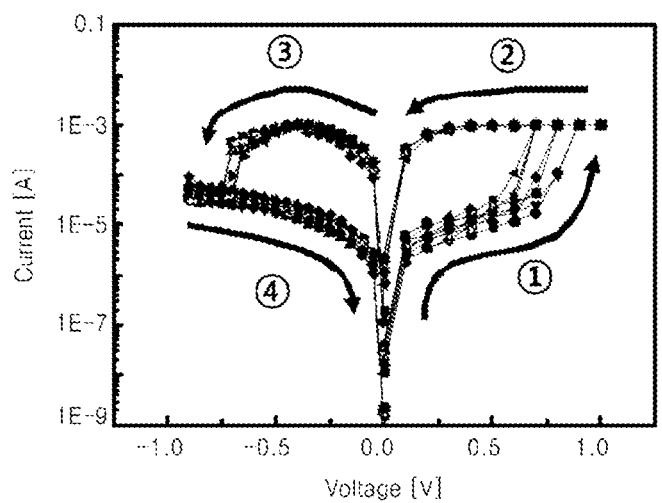
FIG. 5 is a graph illustrating a change in current with respect to an applied voltage in an RRAM device formed on a fiber according to an exemplary embodiment.

FIG. 5 is a graph illustrating a change in current with respect to an applied voltage in an RRAM device formed on a fiber according to an embodiment. FIG. 5 illustrates the result obtained by measuring a current flowing through a memory resistance layer by varying an applied voltage ((1)-(4)) after manufacturing the RRAM device. The RRAM device included a Au lower electrode having a thickness of about 100 nm, a SiC memory resistance layer having a thickness of about 100 nm, and a Cu upper electrode having a thickness of about 100 nm, which were sequentially formed on a fiber substrate.

As apparent from FIG. 5, SiC was a variable resistance material having bi-polar characteristics. When a voltage applied to the Cu upper electrode gradually increased from 0 V with a ground voltage being applied to the Au lower electrode, the applied voltage reached a certain level at which current increased abruptly or resistance decreased (1). This certain level is referred to as a 'set voltage'. When the applied voltage decreased below the set voltage and reached a certain negative voltage, the current decreased abruptly or resistance increased. This negative voltage is referred to as a 'reset voltage'. At the set voltage and at the reset voltage, a transition in a resistance state of the memory resistance layer may occur. When the resistance state of the memory resistance layer is read at a certain voltage, e.g., 0.2 V, the memory resistance layer may act as a memory element since the resistance value thereof may vary in a set operation and in a rest operation. The memory resistance layer may have bi-polar or uni-polar characteristics depending on the type of materials used therein.

Figure 6:
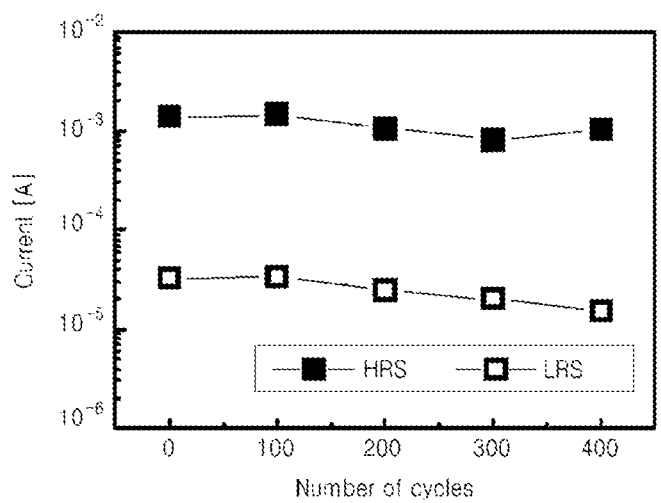
FIG. 6 is a graph illustrating endurance characteristics of an RRAM device formed on a fiber according to an exemplary embodiment.

FIG. 6 is a graph illustrating endurance characteristics of an RRAM device formed on a fiber according to an exemplary embodiment. FIG. 6 illustrates the results obtained by performing set and reset operations about 400 times after manufacturing the RRAM device. The RRAM included a Au lower electrode having a thickness of about 100 nm, a SiC memory resistance layer having a thickness of about 100 nm, and a Cu upper electrode having a thickness of about 100 nm, which were sequentially formed on a fiber substrate.

As is apparent from FIG. 6, a high resistance state (HRS) and a low resistance state (LRS) of the memory resistance layer were maintained with no significant difference over about 400 operations.

Figure 7:
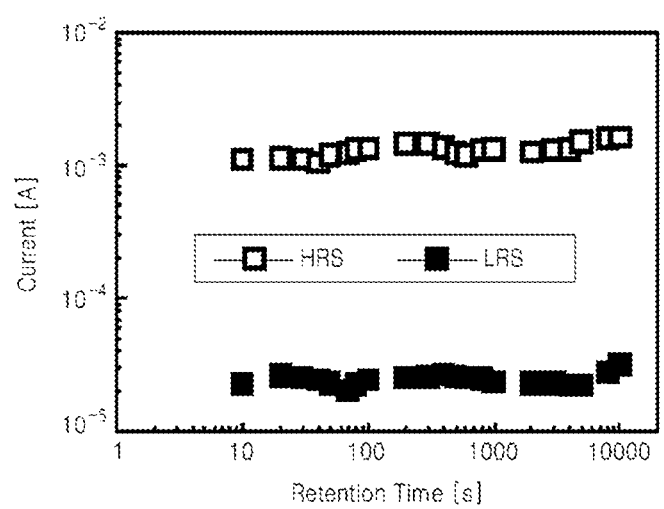
FIG. 7 is a graph illustrating retention characteristics of an RRAM device formed on a fiber according to an exemplary embodiment.

FIG. 7 is a graph illustrating retention characteristics of an RRAM device formed on a fiber according to an exemplary embodiment. FIG. 7 illustrates the result obtained by measuring retention characteristics at about 85° C. after manufacturing the RRAM device. The RRAM included an Au lower electrode having a thickness of about 100 nm, a SiC memory resistance layer having a thickness of about 100 nm, and a Cu upper electrode having a thickness of about 100 nm, which were sequentially formed on a fiber substrate. As apparent from FIG. 7, a high resistance state (HRS) and a low resistance state (LRS) of the memory resistance layer were maintained even after about 10,000 seconds.

According to one or more exemplary embodiments, an RRAM device formed on one or a plurality of fibers and having stable memory characteristics may be provided. A method of manufacturing a thin film transistor (TFT) which facilitates fabrication of an RRAM device formed on one or a plurality of fibers may also be provided.

While certain exemplary embodiments have been particularly shown and described, it should be understood that the exemplary embodiments described herein are descriptive only and do not limit the present disclosure. Thus, the scope of the inventive concept is not defined solely by the exemplary embodiments thereof.

What is claimed is:

1. A resistive random access memory (RRAM) device formed on at least one fiber, the RRAM device comprising:
    an insulating layer directly formed on the at least one fiber for planarization of a surface of the at least one fiber;
    a lower electrode directly disposed on the insulating layer;
    a memory resistance layer disposed on the lower electrode; and
    an upper electrode disposed on the memory resistance layer.

2. The RRAM device of claim 1, further comprising an intermediate electrode and a switching layer, wherein the intermediate electrode and the switching layer are interposed between the memory resistance layer and the upper electrode.

3. The RRAM device of claim 1, wherein the at least one fiber is a natural fiber, a chemical fiber, or a combination thereof.

4. The RRAM device of claim 3, wherein the at least one fiber comprises polystyrene, polyester, or polyurethane.

5. The RRAM device of claim 1, wherein the at least one fiber has a diameter of 20 nm to 150 μm.

6. The RRAM device of claim 1, wherein the at least one fiber is a unidirectional fabric, a quasi-unidirectional fabric, a flat yarn, or a nanofiber.

7. The RRAM device of claim 1, wherein the memory resistance layer is formed of one selected from the group consisting of silicon oxide, tungsten oxide, niobium oxide, germanium antimony telluride ($Ge_2Sb_2Te_5$), zirconium zirconium oxide, hafnium oxide, silicon carbide (SiC), titanium oxide, tantalum oxide, praseodymium calcium manganese oxide (PrCaMnO), polyflourene based organic material, zinc oxide, aluminum oxide, Nb-doped strontium titanium oxide ($SrTiO_3$), vanadium vanadium oxide, Al—Nb co-doped lead zirconium titanium oxide (PbZrTiO), lanthanum aluminum oxide ($LaAlO_3$), Cu-doped molybdenum oxide, gadolinium oxide, lanthanide oxide, praseodymium oxide, dysprosium oxide, europium oxide, and copper carbide (CuC).

8. The RRAM device of claim 1, further comprising a connection to a textile-based sensor system.

* * * * *